(12) United States Patent
Ho et al.

(10) Patent No.: US 8,963,312 B2
(45) Date of Patent: Feb. 24, 2015

(54) STACKED CHIP PACKAGE AND METHOD FOR FORMING THE SAME

(71) Applicant: Xintec Inc., Jhongli, Taoyuan County (TW)

(72) Inventors: Yen-Shih Ho, Kaohsiung (TW); Tsang-Yu Liu, Zhubei (TW); Shu-Ming Chang, New Taipei (TW); Yu-Lung Huang, Daxi Township (TW); Chao-Yen Lin, New Taipei (TW); Wei-Luen Suen, New Taipei (TW); Chien-Hui Chen, Zhongli (TW)

(73) Assignee: Xintec, Inc., Taoyuan (TW)

( * ) Notice: Subject to any disclaimer, the term of this patent is extended or adjusted under 35 U.S.C. 154(b) by 0 days.

(21) Appl. No.: 14/339,341

(22) Filed: Jul. 23, 2014

(65) Prior Publication Data

US 2014/0332983 A1    Nov. 13, 2014

Related U.S. Application Data

(63) Continuation of application No. 13/950,101, filed on Jul. 24, 2013, which is a continuation-in-part of application No. 13/105,775, filed on May 11, 2011, now Pat. No. 8,507,321.

(60) Provisional application No. 62/002,774, filed on May 23, 2014, provisional application No. 61/333,459, filed on May 11, 2010.

(51) Int. Cl.
*H01L 23/02* (2006.01)
*H01L 23/48* (2006.01)
*H01L 21/44* (2006.01)
*H01L 23/00* (2006.01)
*H01L 23/31* (2006.01)

(52) U.S. Cl.
CPC ............... *H01L 24/49* (2013.01); *H01L 24/43* (2013.01); *H01L 23/3121* (2013.01); *H01L 24/85* (2013.01); *H01L 2924/14* (2013.01); *H01L 2224/04042* (2013.01); *H01L 2224/48227* (2013.01); *H01L 2924/146* (2013.01); *H01L 2224/48599* (2013.01)
USPC ................... 257/686; 257/784; 257/E23.141; 438/109; 438/617

(58) Field of Classification Search
USPC ........... 257/686, 784, E23.141; 438/109, 617
See application file for complete search history.

(56) References Cited

U.S. PATENT DOCUMENTS

| | | | |
|---|---|---|---|
| 7,199,345 B1 | 4/2007 | Meisel et al. | |
| 8,125,092 B2 * | 2/2012 | Corisis et al. | 257/784 |
| 8,399,975 B2 * | 3/2013 | Nam | 257/686 |
| 8,736,080 B2 | 5/2014 | Arnold et al. | |
| 2002/0027295 A1 * | 3/2002 | Kikuma et al. | 257/780 |

(Continued)

*Primary Examiner* — Nitin Parekh
(74) *Attorney, Agent, or Firm* — Liu & Liu (57) ABSTRACT

A stacked chip package including a device substrate having an upper surface, a lower surface and a sidewall is provided. The device substrate includes a sensing region or device region, a signal pad region and a shallow recess structure extending from the upper surface toward the lower surface along the sidewall. A redistribution layer is electrically connected to the signal pad region and extends into the shallow recess structure. A wire has a first end disposed in the shallow recess structure and electrically connected to the redistribution layer, and a second end electrically connected to a first substrate and/or a second substrate disposed under the lower surface. A method for forming the stacked chip package is also provided.

23 Claims, 10 Drawing Sheets

(56) References Cited

U.S. PATENT DOCUMENTS

| | | | |
|---|---|---|---|
| 2005/0001301 A1* | 1/2005 | Aoyagi | 257/686 |
| 2008/0174030 A1* | 7/2008 | Liu et al. | 257/777 |
| 2009/0321958 A1* | 12/2009 | Tanaka et al. | 257/777 |
| 2010/0181661 A1* | 7/2010 | Takemoto et al. | 257/686 |
| 2010/0265751 A1* | 10/2010 | Hong | 365/51 |
| 2010/0283140 A1* | 11/2010 | Kim et al. | 257/686 |
| 2010/0314740 A1* | 12/2010 | Choi et al. | 257/686 |
| 2013/0285240 A1 | 10/2013 | Last et al. | |

* cited by examiner

STACKED CHIP PACKAGE AND METHOD FOR FORMING THE SAME

CROSS REFERENCE TO RELATED APPLICATIONS

This Application claims the benefit of U.S. Provisional Application No. 62/002,774, filed May 23, 2014 and is a Continuation-In-Part of U.S. patent application Ser. No. 13/950,101, filed Jul. 24, 2013, which is a Continuation-In-Part of U.S. Pat. No. 8,507,321, filed May 11, 2011, which claims the benefit of U.S. Provisional Application No. 61/333,459, filed May 11, 2010, the entirety of which are incorporated by reference herein.

BACKGROUND OF THE INVENTION

1. Field of the Invention

The invention relates to chip package technology, and in particular to a stacked chip package and methods for forming the same.

2. Description of the Related Art

The chip packaging process is an important step in the fabrication of an electronic product. Chip packages not only protect the chips therein from outer environmental contaminants, but also provide electrical connection paths between electronic elements inside and outside of the chip packages.

Figure 1:
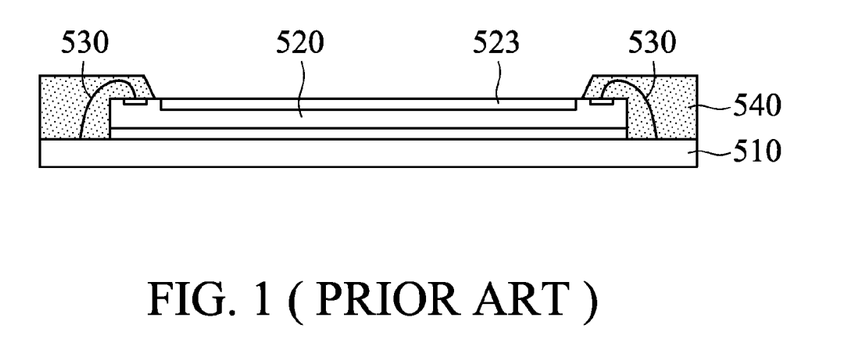
FIG. 1 is a cross-sectional view of a conventional chip package.

A conventional chip package having sensing functions, such as a fingerprint-recognition chip package shown in FIG. 1, includes a fingerprint-recognition chip 520 on a printed circuit board 510. Wires 530 are electrically connected between a signal pad region of the fingerprint-recognition chip 520 and the printed circuit board 510. The fingerprint-recognition chip 520 and the wires 530 are covered by an encapsulant layer 540. Since the wires 530 protruding from an upper surface of the fingerprint-recognition chip 520 are protected by the encapsulant layer 540, the thickness of the encapsulant layer 540 is limited by the height of the wires 530. In order to prevent sensitivity of a sensing region 523 in the center of the fingerprint-recognition chip 520 from being affected by the thick encapsulant layer 540, the thick encapsulant layer 540 covers the periphery of the fingerprint-recognition chip 520 and exposes the sensing region 523. Therefore, the chip package cannot have a flat surface above the fingerprint-recognition chip 520 and the size of the chip package cannot be further reduced. In addition, since the wires 530 are adjacent to the edges of the fingerprint-recognition chip 520, they easily contact the edges during the bonding process which may result in a short circuit or a broken circuit, thereby reducing the yield of the chip package.

Thus, there exists a need in the art for development of a stacked chip package and methods for forming the same capable of reducing the thickness of the encapsulant layer thereby improving sensitivity of the stacked chip package and providing a stacked chip package having a flat contacting surface and a smaller size.

BRIEF SUMMARY OF THE INVENTION

An embodiment of the invention provides a stacked chip package comprising a device substrate having a first upper surface, a first lower surface and a sidewall. The device substrate comprises a sensing region or device region, a signal pad region adjacent to the first upper surface and a shallow recess structure extending from the first upper surface toward the first lower surface along the sidewall. A redistribution layer is electrically connected to the signal pad region and extends into the shallow recess structure. A first substrate and a second substrate are disposed under the first lower surface, and the first substrate is disposed between the device substrate and the second substrate. A wire has a first end and a second end. The first end is disposed in the shallow recess structure and is electrically connected to the redistribution layer, and the second end is electrically connected to the first substrate and/or the second substrate.

Another embodiment of the invention provides a stacked chip package comprising an upper substrate having a first upper surface, a first lower surface and a first sidewall. The upper substrate comprises a first signal pad region adjacent to the first upper surface and a first shallow recess structure extending from the first upper surface toward the first lower surface along the first sidewall. A lower substrate has a second upper surface, a second lower surface and a second sidewall, wherein the lower substrate comprises a second signal pad region adjacent to the second upper surface and a second shallow recess structure extending from the second upper surface toward the second lower surface along the second sidewall. A first redistribution layer is electrically connected to the first signal pad region and extends into the first shallow recess structure. A second redistribution layer is electrically connected to the second signal pad region and extends into the second shallow recess structure. A first wire is disposed in the first shallow recess structure, wherein the first wire is electrically connected to the first redistribution layer and the lower substrate or a circuit board. A second wire is disposed in the second shallow recess structure, wherein the second wire is electrically connected to the second redistribution layer and the upper substrate or the circuit board.

An embodiment of the invention provides a method for forming a stacked chip package comprising providing a device substrate having a first upper surface, a first lower surface and a sidewall. The device substrate comprises a sensing region or device region, a signal pad region adjacent to the first upper surface, and a shallow recess structure extending from the first upper surface toward the first lower surface along the sidewall. The shallow recess structure has at least a first recess and a second recess under the first recess. A redistribution layer extends into the shallow recess structure to electrically connect to the signal pad region. A first substrate and a second substrate are provided under the first lower surface, and the first substrate is located between the device substrate and the second substrate. A wire having a first end and a second end is formed. The first end is disposed in the shallow recess structure and electrically connected to the redistribution layer, and the second end is disposed on and electrically connected to the first or second substrate. The wire, the first upper surface, the first substrate and the second substrate are covered by an encapsulant layer to form a flat contacting region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A stacked chip package according to an embodiment of the present invention may be used to package micro-electromechanical system chips. However, embodiments of the invention are not limited thereto. For example, the stacked chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 2A:
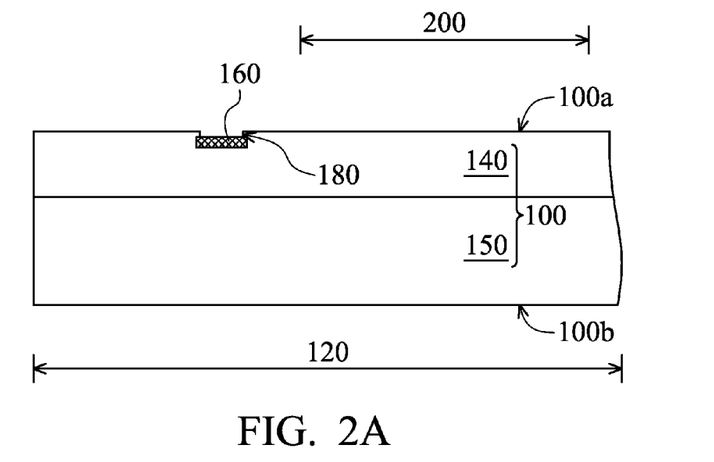
FIGS. 2A-2F are cross-sectional views of an exemplary embodiment of a method for forming a stacked chip package according to the invention.
Figure 2B:
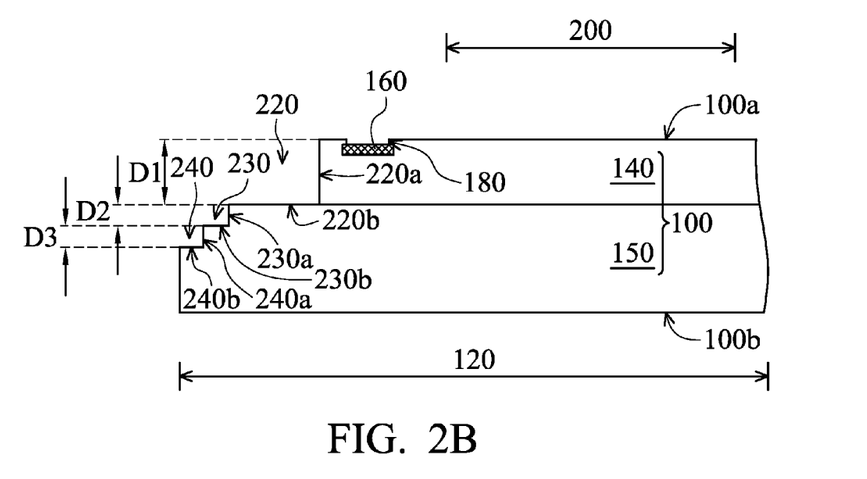
Figure 2C:
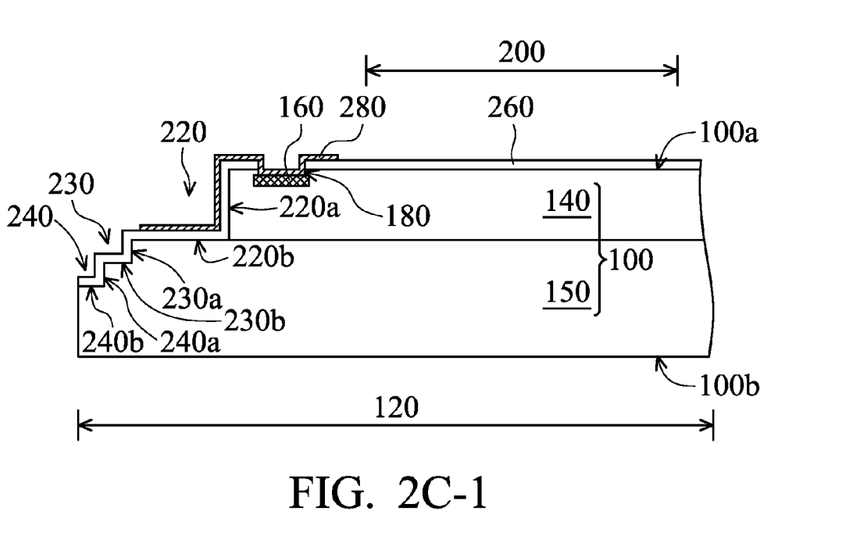
Figure 2C:
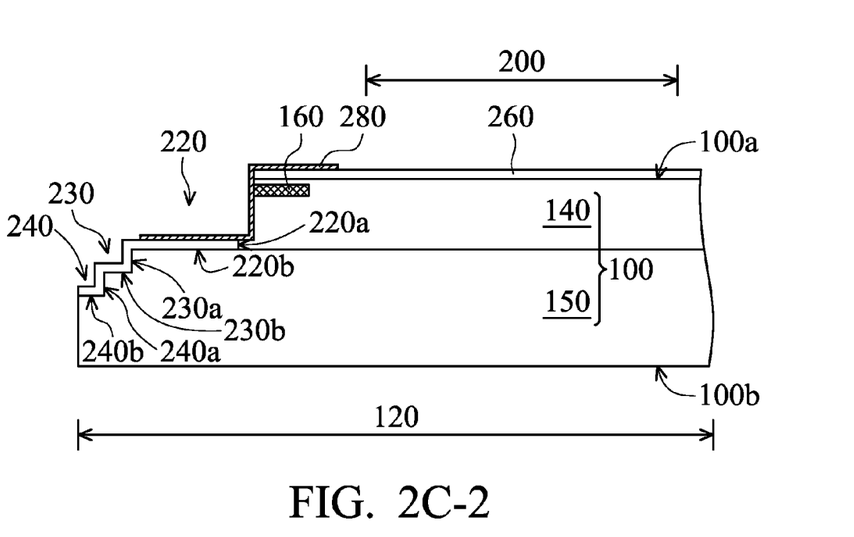
Figure 2C:
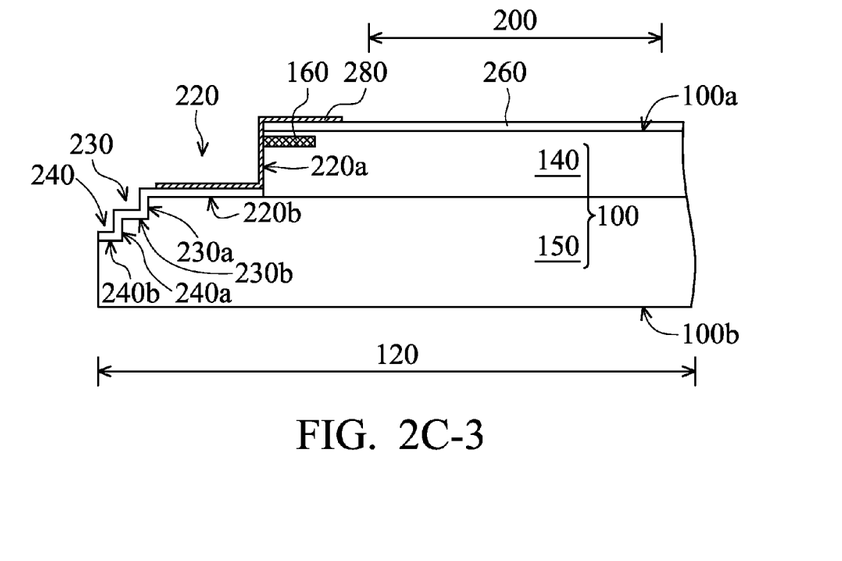
Figure 2D:
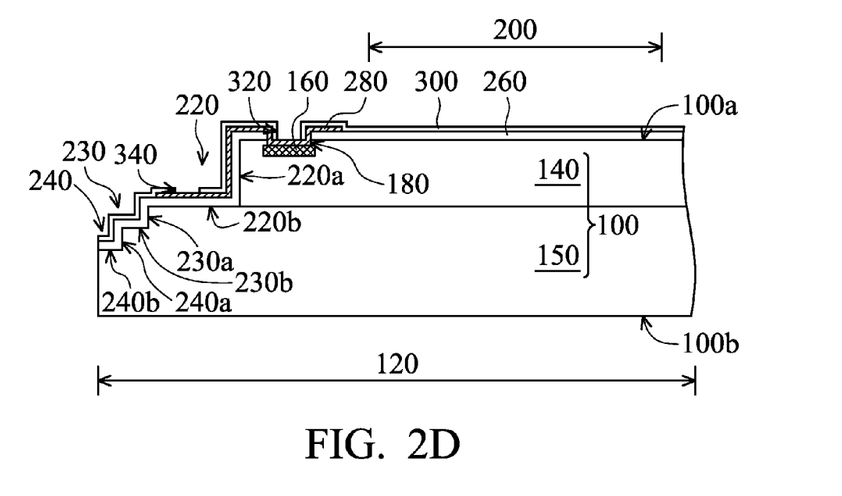
Figure 2E:
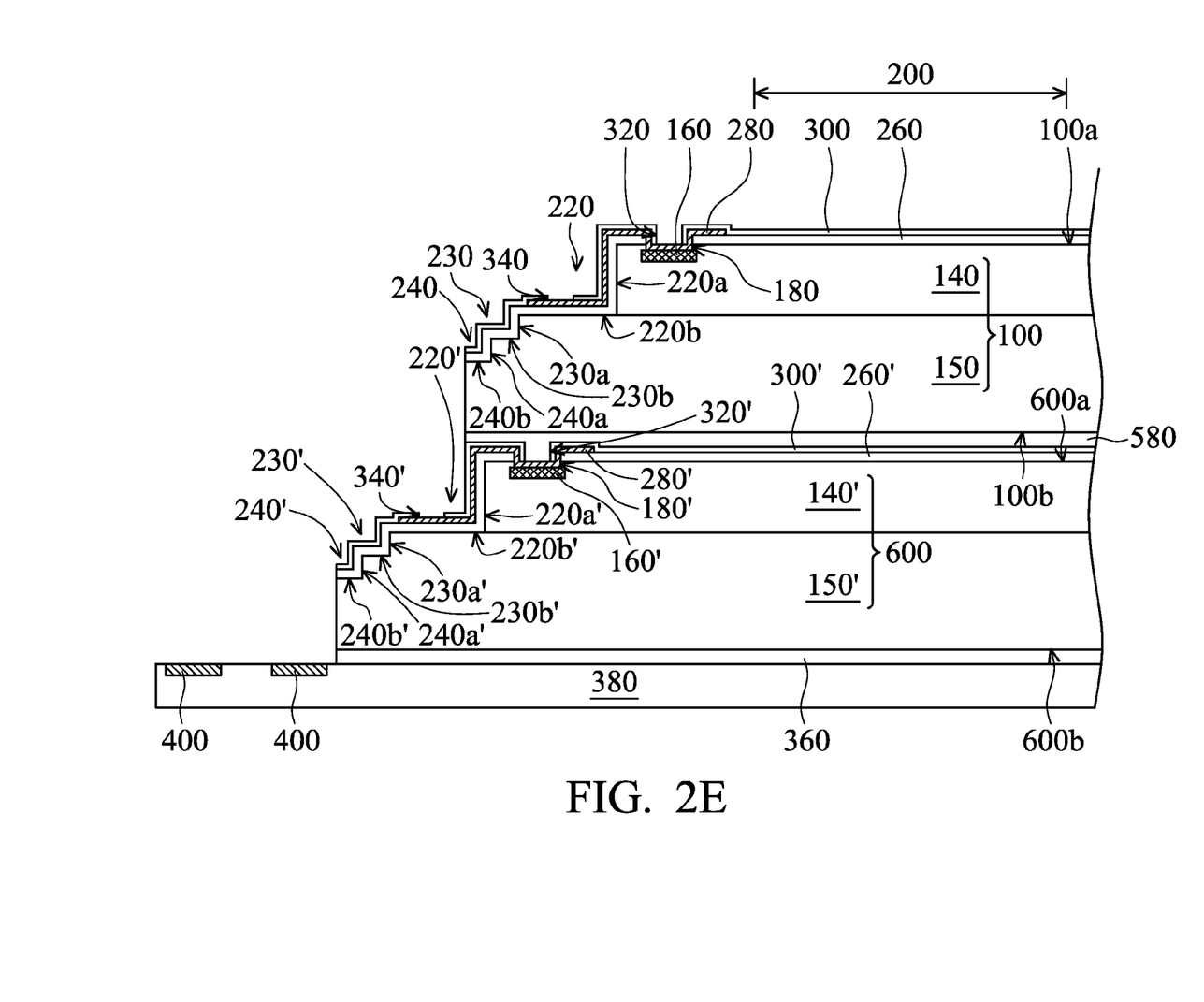
Figure 2F:
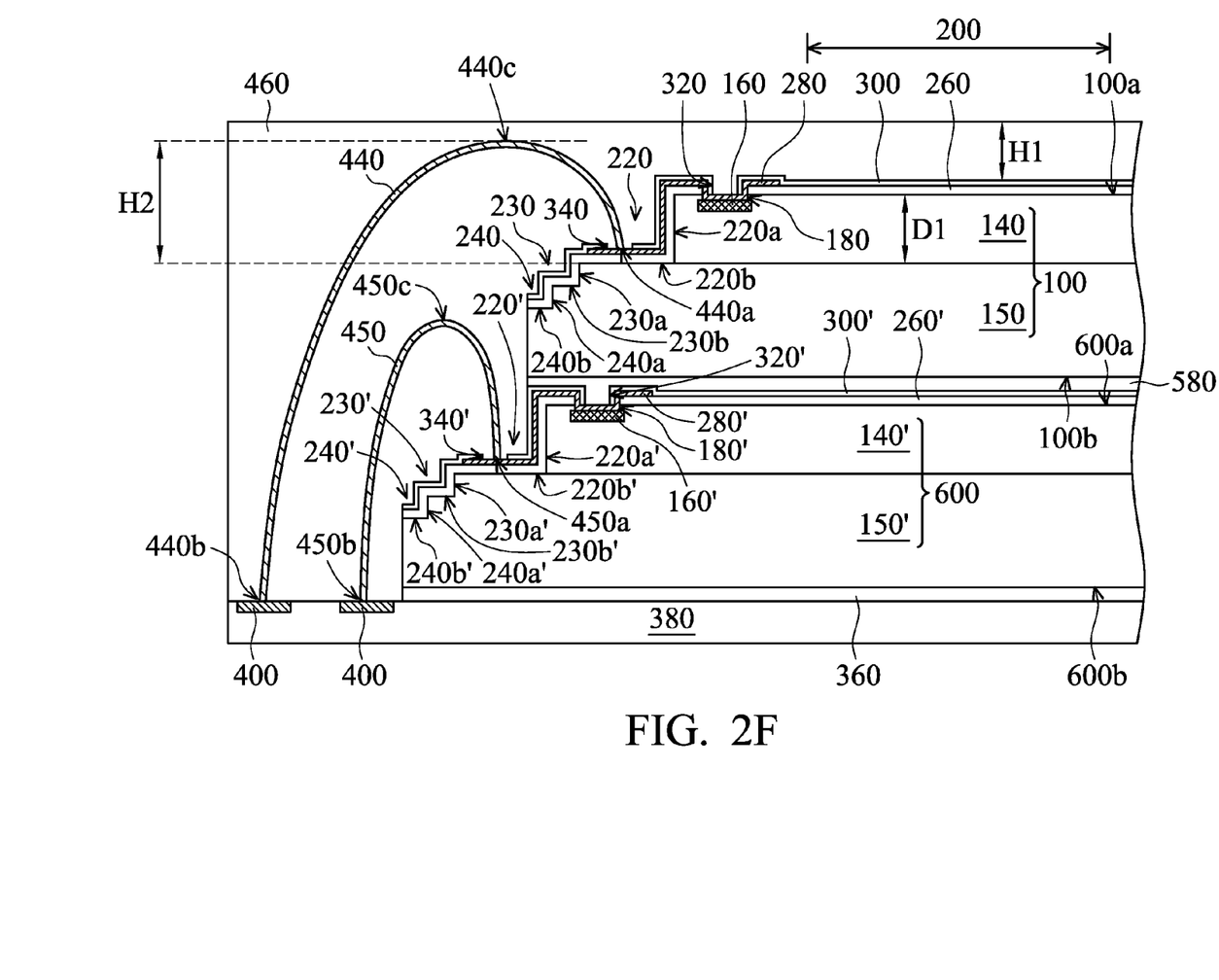

Referring to FIG. 2F, a cross-sectional view of an exemplary embodiment of a stacked chip package according to the invention is illustrated. To simplify the diagram, only a portion of the stacked chip package is shown herein. In the embodiment, the stacked chip package comprises a device substrate/upper substrate 100, a redistribution layer 280, a first substrate/lower substrate 600, a second substrate 380 and a wire 440. The device substrate 100 has a first upper surface 100*a* and a first lower surface 100*b*. In one embodiment, the device substrate 100 comprises an insulating layer 140 adjacent to the first upper surface 100*a* and an underlying substrate 150 adjacent to the first lower surface 100*b*. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In the embodiment, the device substrate 100 comprises a signal pad region 160 and a sensing region or device region 200 which are adjacent to the first upper surface 100*a*. In one embodiment, the signal pad region 160 comprises a plurality of conducting pads and each conducting pad may be a single conducting layer or comprise multiple conducting layers. To simplify the diagram, only one conducting pad comprising a single conducting layer in the insulating layer 140 is depicted herein as an example. In the embodiment, the insulating layer 140 may comprise one or more openings 180 exposing the respective conducting pads.

In one embodiment, the sensing region or device region 200 of the device substrate 100 comprises a sensing component which may be used for sensing biometric features (i.e., the device substrate 100 is a biometric sensing chip, such as a fingerprint-recognition chip). In another embodiment, the device substrate 100 may be used for sensing environmental features. For example, the device substrate 100 may comprise a temperature-sensing component, a humidity-sensing component, a pressure-sensing component, a capacitance-sensing component or another suitable sensing component. In yet another embodiment, the device substrate 100 may comprise an image-sensing component. In one embodiment, the sensing component in the device substrate 100 may be electrically connected to the signal pad region 160 by an interconnection structure (not shown) in the insulating layer 140.

In the embodiment, the device substrate 100 further comprises a shallow recess structure formed of a first recess 220, a second recess 230 and a third recess 240. The first recess 220 extends from the first upper surface 100*a* toward the first lower surface 100*b* along a sidewall of the device substrate 100 to expose the underlying substrate 150, and has a first sidewall 220*a* and a first bottom 220*b*. In one embodiment, the first sidewall 220*a* adjoins the insulating layer 140 (i.e., the first sidewall 220*a* is an edge of the insulating layer 140). In other embodiments, the first sidewall 220*a* may further extend into the underlying substrate 150. In the embodiment, the first recess 220 has a depth D1 no greater than 15 μm. In one embodiment, the first sidewall 220*a* may be substantially perpendicular to the first upper surface 100*a*. For example, the angle between the first sidewall 220*a* and the first upper surface 100*a* may be in a range of about 84° to about 90°. In other embodiments, the first sidewall 220*a* may be inclined to the first upper surface 100*a*. For example, the angle between the first sidewall 220*a* and the first upper surface 100*a* may be in a range of about 55° to about 90°.

The second recess 230 extends from the first bottom 220*b* toward the first lower surface 100*b* along the sidewall of the device substrate 100, and has a second sidewall 230*a* and a second bottom 230*b*. In the embodiment, the second sidewall 230*a* is substantially perpendicular to the first upper surface 100*a*. In other embodiments, the second sidewall 230*a* may be inclined to the first upper surface 100*a*. In one embodiment, the second sidewall 230*a* adjoins the substrate 150. In one embodiment, the second recess 230 has a depth D2 (shown in FIG. 2B) smaller than the depth D1. In one embodiment, the second bottom 230*b* has a width that is smaller than that of the first bottom 220*b*.

The third recess 240 extends from the second bottom 230*b* toward the first lower surface 100*b* along the sidewall of the device substrate 100, and has a third sidewall 240*a* and a third bottom 240*b*. In the embodiment, the third sidewall 240*a* is substantially perpendicular to the first upper surface 100*a*. In other embodiments, the third sidewall 240*a* may be inclined to the first upper surface 100*a*. In one embodiment, the third recess 240 has a depth D3 (shown in FIG. 2B) equal to the depth D2. In other embodiments, the depth D3 may smaller or greater than the depth D2. In one embodiment, the third bottom 240*b* has a width equal to that of the second bottom 230*b*. In other embodiments, the width of the third bottom 240*b* may be smaller or greater than that of the second bottom 230*b*.

In one embodiment, an optional insulating layer 260 may be conformally disposed on the first upper surface 100*a* of the device substrate 100. The insulating layer 260 extends to the third sidewall 240*a* and the third bottom 240*b* through the first recess 220 and the second recess 230, and exposes a portion of the signal pad region 160. In the embodiment, the insulating layer 260 may comprise inorganic materials, such as silicon oxide, silicon nitride, silicon oxynitride, metal oxide, a combination thereof, or another suitable insulating material.

A redistribution layer (RDL) 280 is patterned and conformally disposed on the insulating layer 260. The redistribution layer 280 extends into the opening 180 and onto the first sidewall 220*a* and the first bottom 220*b* and is electrically connected to the exposed signal pad region 160 through the opening 180. In other embodiments, the redistribution layer 280 may further extend onto the second bottom 230*b* or the third bottom 240*b*. In one embodiment, when the substrate 150 comprises a semiconductor material, the redistribution layer 280 can be electrically insulated from the semiconductor material by the insulating layer 260. In one embodiment, the redistribution layer 280 may comprise copper, aluminum, gold, platinum, nickel, tin, a combination thereof, conductive polymer materials, conductive ceramic materials (such as indium tin oxide or indium zinc oxide), or another suitable conducting material.

A protection layer 300 is conformally disposed on the redistribution layer 280 and the insulating layer 260 and extends into the first recess 220, the second recess 230 and the third recess 240. The protection layer 300 comprises one or more openings exposing a portion of the redistribution layer 280. In the embodiment, the protection layer 300 comprises openings 320 and 340 respectively exposing the redistribution layer 280 on the signal pad region 160 and in the first recess 220. In another embodiment, the protection layer 300 may merely comprise the opening 340. For example, the redistribution layer 280 on the signal pad region 160 may be fully covered by the protection layer 300. In other embodiments, the protection layer 300 may comprise a plurality of openings 340 respectively exposing a portion of the redistribution layer 280 in the first recess 220, the second recess 230 and the third recess 240. In the embodiment, the protection layer 300 may comprise inorganic materials, such as silicon oxide, silicon nitride, silicon oxynitride, metal oxide, a combination thereof, or another suitable insulating material.

The first substrate 600 having a second upper surface 600*a* and a second lower surface 600*b* is attached onto the first lower surface 100*b* by an adhesive layer (such as a glue) 580. In the embodiment, the first substrate 600 may be a chip, such as a processor, or an interposer. Moreover, the first substrate 600 has a larger size than that of the device substrate 100. In one embodiment, the first substrate 600 has the same structure as that of the device substrate 100. For example, the first substrate 600 comprises an insulating layer 140' adjacent to the second upper surface 600*a* and an underlying substrate 150' adjacent to the second lower surface 600*b*. Moreover, the first substrate 600 further comprises a signal pad region 160' which may be adjacent to the second upper surface 600*a*, and a shallow recess structure extending from the second upper surface 600*a* toward the second lower surface 600*b* along a sidewall of the first substrate 600. The shallow recess structure comprises a first recess 220', a second recess 230' and a third recess 240'. In other embodiments, the first substrate 600 may have a structure that is different from that of the device substrate 100.

In addition, when the first substrate 600 has the same structure as that of the device substrate 100, an insulating layer 260', a redistribution layer 280' and a protection layer 300' are sequentially disposed on the second upper surface 600*a* and between the first substrate 600 and the device substrate 100. Elements 140', 150', 160', 180', 220', 220*a*', 220*b*', 230', 230*a*', 230*b*', 240', 240*a*', 240*b*', 260', 280', 300', 320' and 340' in and on the first substrate 600 that are the same as those elements 140, 150, 160, 180, 220, 220*a*, 220*b*, 230, 230*a*, 230*b*, 240, 240*a*, 240*b*, 260, 280, 300, 320 and 340 in and on the device substrate 100, respectively, are not described again for brevity.

The second substrate 380 is attached onto the second lower surface 600*b* by an adhesive layer (such as a glue) 360. In the embodiment, the second substrate 380 may be a chip, an interposer or a circuit board. Using a circuit board as an example, it may have one or more conducting pads 400 adjacent to an upper surface of the circuit board. The upper surface of the circuit board is adjacent to the second lower surface 600*b*. Similarly, the conducting pad 400 may be a single conducting layer or comprise multiple conducting layers. To simplify the diagram, only two conducting pads 400 formed of a single conducting layer are depicted herein as an example.

The wire 440 has a first end 440*a* and a second end 440*b*. The first end 440*a* is disposed in the shallow recess structure of the device substrate 100 and electrically connected to the redistribution layer 280 extending to the first bottom 220*b* through the opening 340. The second end 440*b* is disposed on and electrically connected to one of the conducting pads 400 of the second substrate 380. In one embodiment, the highest portion 440*c* of the wire 440 protrudes from the first upper surface 100*a*. In other embodiments, the highest portion 440*c* of the wire 440 may be lower than the first upper surface 100*a*. In the embodiment, the second end 440*b* of the wire 440 is an initial end for wire bonding. Moreover, the wire 440 may comprise gold or another suitable conducting material.

In another embodiment, when the redistribution layer 280 on the device substrate 100 extends to the second bottom 230*b* and the opening 340 in the protection layer 300 is in the second recess 230, the first end 440*a* may be disposed in the second recess 230 of the device substrate 100 and electrically connected to the redistribution layer 280 extending to the second bottom 230*b* through the opening 340. In other embodiments, when the redistribution layer 280 on the device substrate 100 extends to the third bottom 240*b* and the opening 340 in the protection layer 300 is in the second recess 230 or the third recess 240, the first end 440*a* may be disposed in the second recess 230 or the third recess 240 of the device substrate 100. In this case, the depth of the second recess 230 or the third recess 240 may be deeper than that of the first recess 220 and the lateral width of the second bottom 230*b* or the third bottom 240*b* may be greater than that of the first bottom 220*b*.

In the embodiment, the stacked chip package further comprises a wire 450 having a first end 450*a* and a second end 450*b*. The first end 450*a* is disposed in the shallow recess structure of the first substrate 600 and electrically connected to the redistribution layer 280' extending to the first bottom 220b' through the opening 340'. The second end 450b is disposed on and electrically connected to another conducting pad 400 of the second substrate 380. In one embodiment, the highest portion 450c of the wire 450 protrudes from the second upper surface 600a. In other embodiments, the highest portion 450c of the wire 450 may be lower than the second upper surface 600a. In the embodiment, the second end 450b of the wire 450 may be an initial end for wire bonding. Moreover, the wire 450 may comprise gold or another suitable conducting material. Similar to the first end 440a of the wire 440, in other embodiments, the first end 450a may be disposed in the second recess 230' or the third recess 240' of the first substrate 600.

An encapsulant layer 460 optionally covers the wires 440 and 450, and the first and second substrates 600 and 380 or it may further extend onto the first upper surface 100a to form a flat contacting region above the sensing region or device region 200. In the embodiment, the encapsulant layer 460 may comprise molding materials or sealing materials.

In one embodiment, when the highest portion 440c of the wire 440 protrudes from the first upper surface 100a, the encapsulant layer 460 on the sensing region or device region 200 has a thickness H1 determined by a difference between a distance H2 from the first bottom 220b to the highest portion 440c and the depth D1 of the first recess 220 (i.e., H2−D1). Therefore, the thickness H1 of the encapsulant layer 460 covering the sensing region or device region 200 can be reduced by adjusting the depth D1 of the first recess 220, such that sensitivity of the sensing region or device region 200 is increased.

In one embodiment, a decorative layer (not shown) may additionally be disposed on the encapsulant layer 460 and may have colors according to design demands to show regions having sensing functions. A protection layer (not shown), such as sapphire substrate or hard rubber, may additionally be disposed on the decorative layer to further provide an abrasion-resistant, scrape-proof and high-reliability surface. Therefore, the sensing device can be prevented from being contaminated or damaged while the sensing functions of the stacked chip package are being executed.

Figure 3:
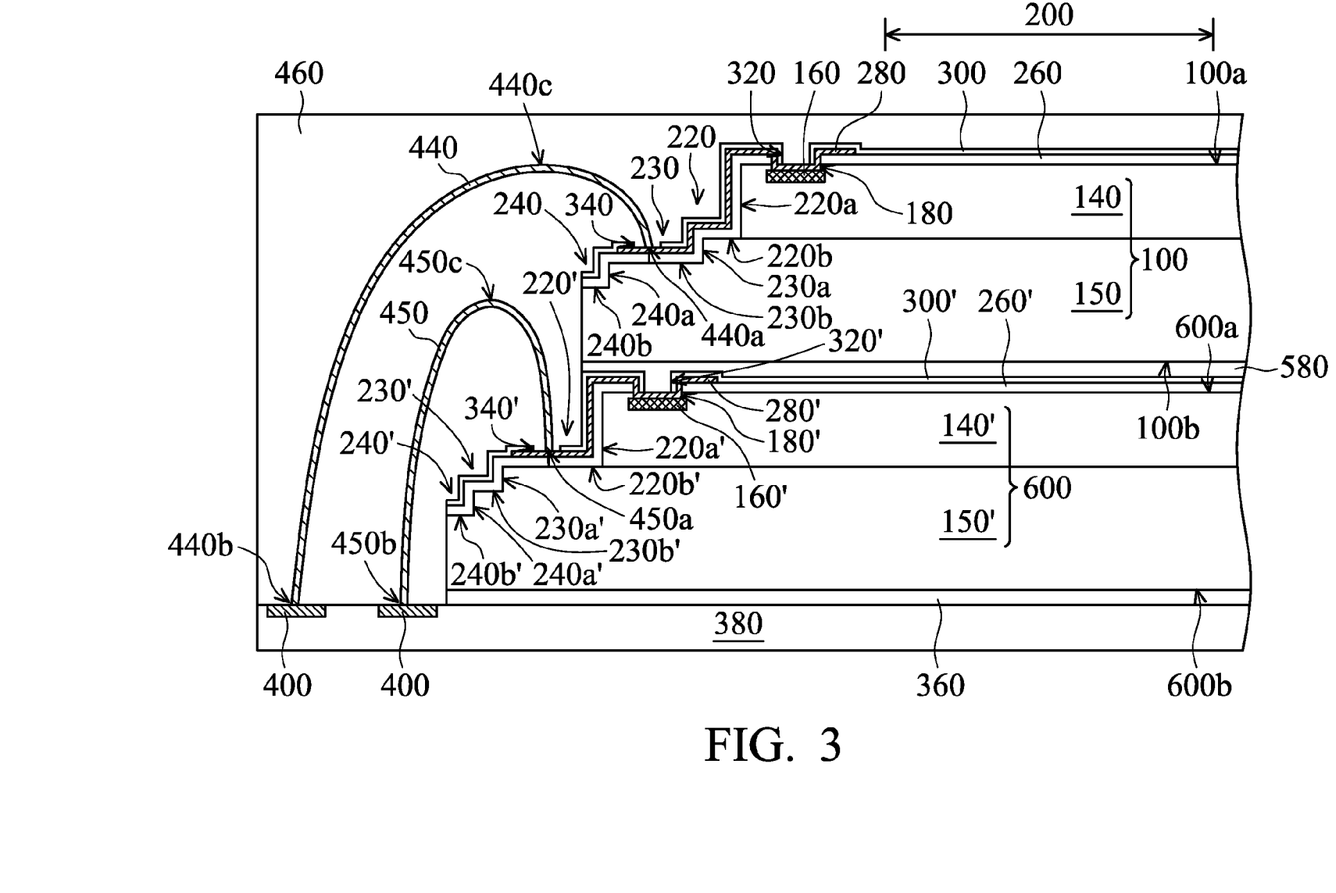
FIGS. 3 and 4 are cross-sectional views of various exemplary embodiments of a stacked chip package according to the invention.
Figure 4:
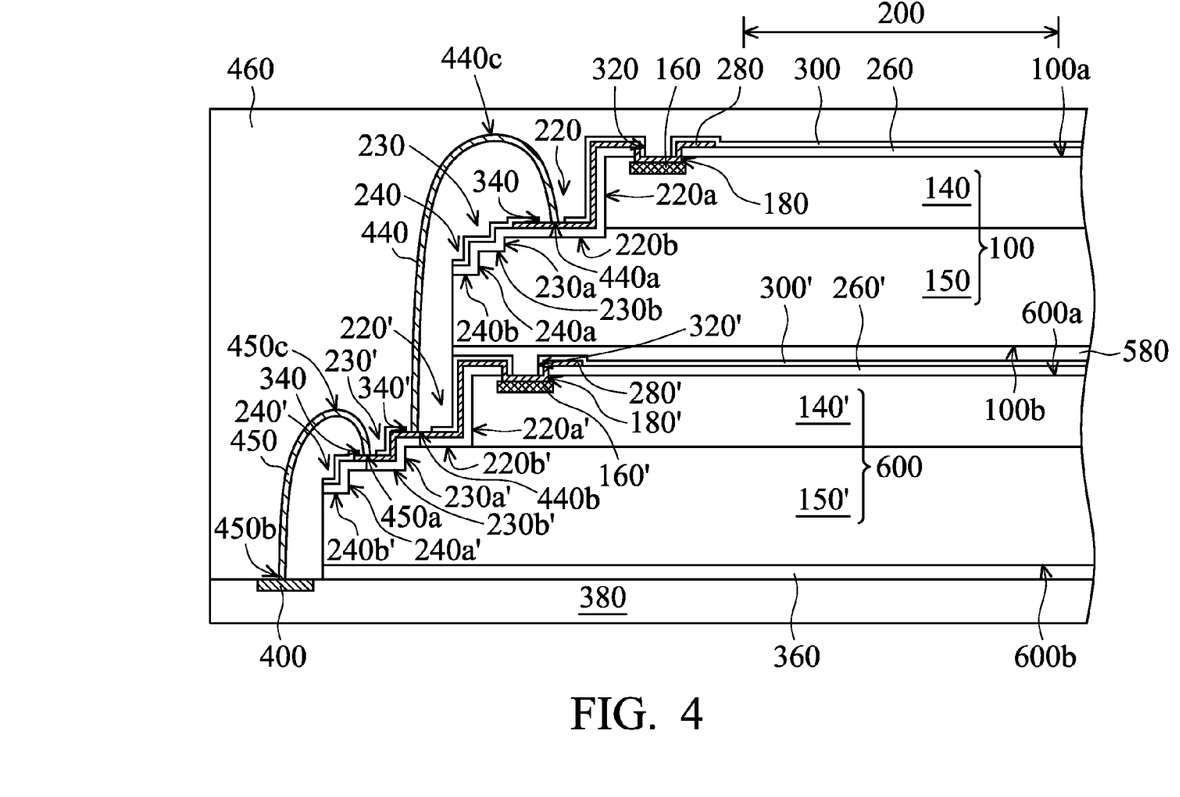

Referring to FIGS. 3 and 4, cross-sectional views of various exemplary embodiments of a stacked chip package according to the invention are illustrated, wherein elements in FIGS. 3 and 4 that are the same as those in FIG. 2F are labeled with the same reference numbers as in FIG. 2F and are not described again for brevity. To simplify the diagram, only a portion of the stacked chip package is shown herein. The stacked chip package structure shown in FIG. 3 is similar to that shown in FIG. 2F. The difference therebetween is that the second bottom 230b of the device substrate 100 shown in FIG. 3 has a lateral width that is greater than that of the first bottom 220b of the device substrate 100. Furthermore, the redistribution layer 280 further extends to the second sidewall 230a and the second bottom 230b of the device substrate 100, the opening 340 is in the second recess 230 of the device substrate 100, and the first end 440a is formed on and electrically connected to the redistribution layer 280 extending to the second bottom 230b through the opening 340. Therefore, the highest portion 440c of the wire 440 can be lower than the first upper surface 100a.

The stacked chip package structure shown in FIG. 4 is similar to that shown in FIG. 3. The difference therebetween is that the first recess 220 of the device substrate 100 shown in FIG. 4 further extends into the substrate 150, such that the highest portion 440c of the wire 440 can be lower than the first upper surface 100a. Moreover, the second end 440b is disposed in the shallow recess structure of the first substrate 600. For example, the second end 440b is disposed on and electrically connected to the redistribution layer 280' extending to the first bottom 220b' of the first substrate 600 through the opening 340'. In addition, the redistribution layer 280' on the first substrate 600 further extends to the second sidewall 230a' and the second bottom 230b', and the protection layer 300' on the first substrate 600 further comprises another opening 340' exposing the redistribution layer 280'. The first end 450a of the wire 450 is disposed on and electrically connected to the redistribution layer 280' extending to the second bottom 230b' of the first substrate 600 through the opening 340'.

Figure 5:
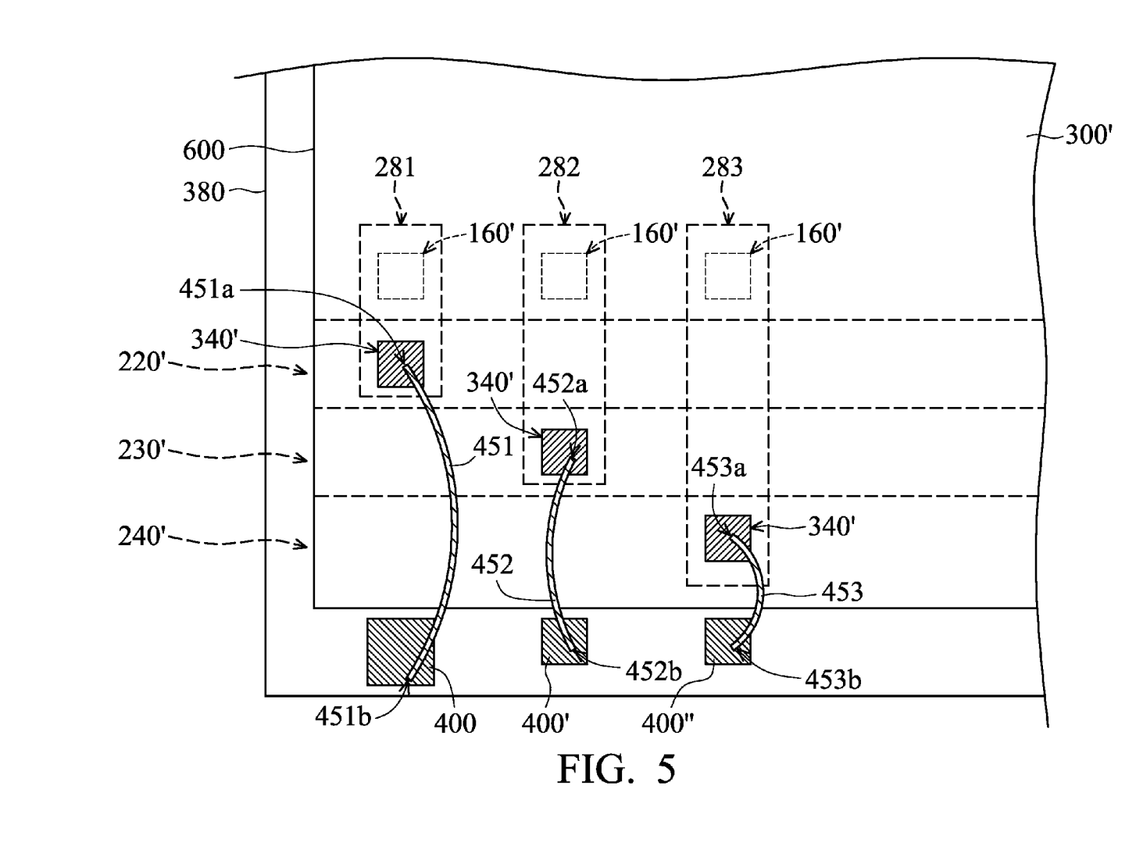
FIGS. 5 and 6 are partial plan views of various exemplary embodiments of a stacked chip package according to the invention.
Figure 6:
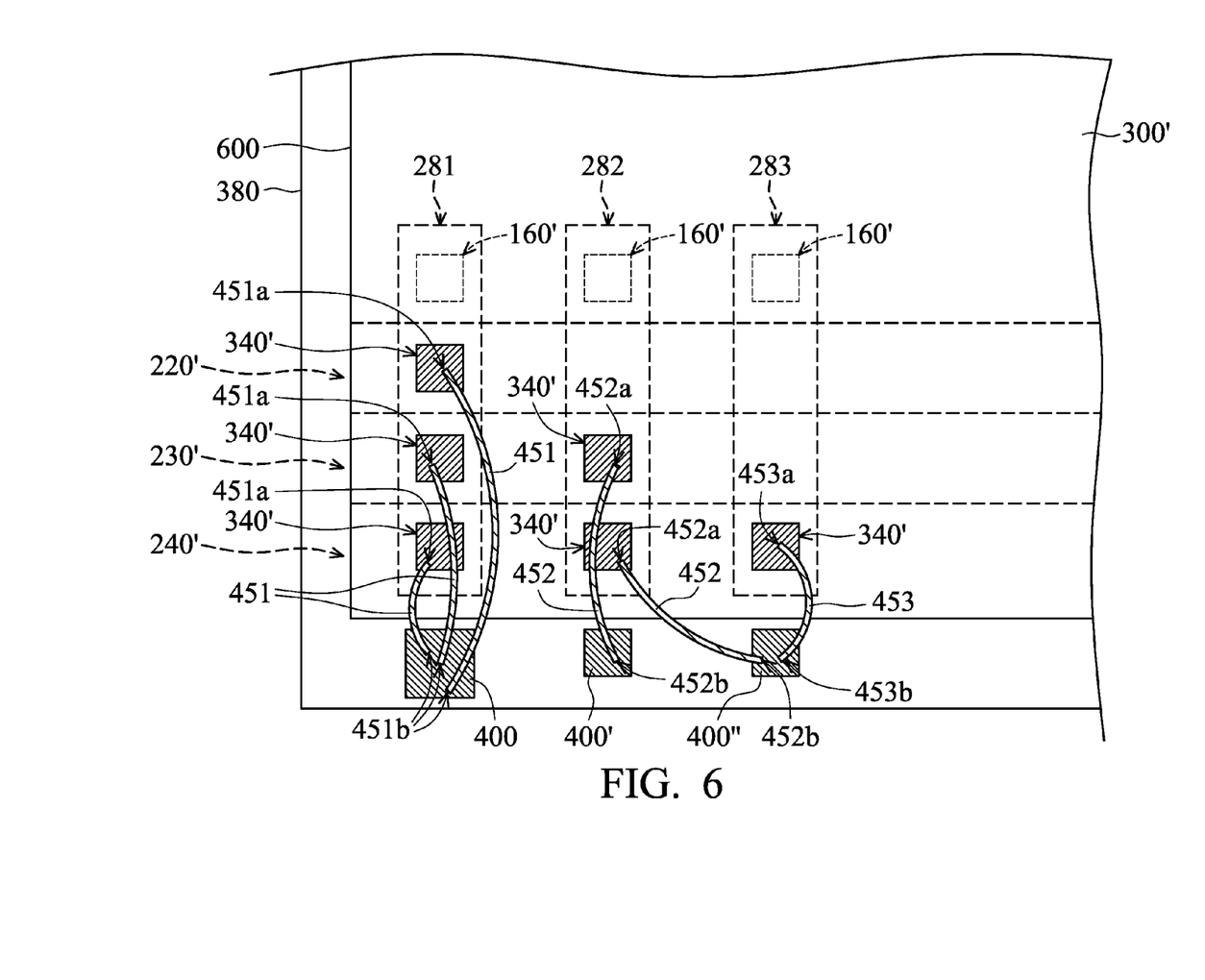

Referring to FIGS. 5 and 6, partial plan views of various exemplary embodiments of a stacked chip package according to the invention are illustrated, wherein elements in FIGS. 5 and 6 that are the same as those in FIGS. 2F, 3 and 4 are labeled with the same reference numbers as in FIGS. 2F, 3 and 4, and are not described again for brevity. The stacked chip packages shown in FIGS. 5 and 6 are similar to those shown in FIGS. 2F, 3 and 4, and comprise a device substrate, a first substrate 600 and a second substrate 380 stacked vertically in an encapsulant layer. To simplify the diagram, the encapsulant layer and the device substrate on the first substrate 600 are not shown in FIGS. 5 and 6.

As shown in FIG. 5, the first recess 220', the second recess 230' and the third recess 240' in the first substrate 600 laterally extend along an edge of the first substrate 600. Redistribution layers 281, 282 and 283 are disposed on the upper surface of the first substrate 600 to electrically connect the respective signal pad regions 160' of the first substrate 600, and respectively extend into the first recess 220', the second recess 230' and the third recess 240'. In order to clearly show the relative positions of elements in the stacked chip package, contours of the signal pad regions 160' and the redistribution layers 281, 282 and 283 are shown by dotted lines.

The protection layer 300' covers the first substrate 600 and comprises openings 340' respectively exposing a portion of the redistribution layers 281 in the first recess 220', a portion of the redistribution layers 282 in the second recess 230', and a portion of the redistribution layers 283 in the third recess 240'. The redistribution layers 281, 282 and 283 are electrically connected to the conducting pads 400, 400', and 400'' of the second substrate 380 through wires 451, 452 and 453, respectively. For example, a first end 451a of the wire 451 is disposed on and electrically connected to the redistribution layer 281 in the first recess 220' through the opening 340', and a second end 451b of the wire 451 is disposed on and electrically connected to the conducting pad 400. A first end 452a of the wire 452 is disposed on and electrically connected to the redistribution layer 282 in the second recess 230' through the opening 340', and a second end 452b of the wire 452 is disposed on and electrically connected to the conducting pad 400'. A first end 453a of the wire 453 is disposed on and electrically connected to the redistribution layer 283 in the third recess 240' through the opening 340', and a second end 453b of the wire 453 is disposed on and electrically connected to the conducting pad 400''. In the embodiment, the second ends 451b, 452b or 453b may be an initial end for wire bonding.

The stacked chip package structure shown in FIG. 6 is similar to that shown in FIG. 5. The difference therebetween is that all of the redistribution layers 281, 282 and 283 extend into the third recess 240'. Moreover, the protection layer 300' in the second recess 230' comprises two openings 340' respectively exposing a portion of the redistribution layers 281 and 282, and the protection layer 300' in the third recess 240' comprises three openings 340' respectively exposing a portion of the redistribution layers 281, 282 and 283.

In one embodiment, the exposed portions of the redistribution layer 281 in the first recess 220', the second recess 230' and the third recess 240' are electrically connected to the same conducting pad 400 by three wires 451. The exposed portion of the redistribution layer 282 in the second recess 230' is electrically connected to the respective conducting pad 400' by the wire 452. Moreover, the exposed portions of the redistribution layers 282 and 283 in the third recess 240' are electrically connected to the conducting pad 400" by the wires 452 and 453, respectively.

In addition, although not shown in the figures, it should be realized that the redistribution layer, the opening in the protection layer, and the wire may have other arrangements as long as the redistribution layer is electrically connected to the conducting pad. Moreover, the arrangements of the wires between the first and second substrates shown in FIGS. 5 and 6 can be implemented to those arrangements of the wires between the device substrate and the second substrate or between the device substrate and the first substrate.

According to the aforementioned embodiments, since the device substrate 100 comprises a shallow recess structure having the first end 440a of the wire 440 therein, the distance between the highest portion 440c of the wire 440 and the first upper surface 100a is reduced. Therefore, the thickness H1 of the encapsulant layer 460 covering the sensing region or device region 200 can be reduced. Moreover, the thickness H1 can be further reduced by adjusting the highest portion 440c of the wire 440 to be lower than the first upper surface 100a. As a result, the sensitivity of the sensing region or device region 200 is increased and the quality of the stacked chip package is improved. Furthermore, the size of the stacked chip package is further reduced and a flat contacting surface can be formed above the sensing region or device region 200.

An exemplary embodiment of a method for forming a stacked chip package according to the invention is illustrated with FIGS. 2A to 2F, wherein FIGS. 2A to 2F are cross-sectional views of an exemplary embodiment of a method for forming a stacked chip package according to the invention.

Referring to FIG. 2A, a device substrate/upper substrate 100, such as a wafer, having a plurality of chip regions 120 is provided. To simplify the diagram, only a portion of single chip region 120 is shown herein. The device substrate 100 has a first upper surface 100a and a first lower surface 100b. In one embodiment, the device substrate 100 comprises an insulating layer 140 adjacent to the first upper surface 100a and an underlying substrate 150 adjacent to the first lower surface 100b. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In the embodiment, the device substrate 100 in each chip region 120 comprises a signal pad region 160 and a sensing region or device region 200 which are adjacent to the first upper surface 100a. In one embodiment, the signal pad region 160 comprises a plurality of conducting pads and each conducting pad may be a single conducting layer or comprise multiple conducting layers. To simplify the diagram, only one conducting pad formed of a single conducting layer in the insulating layer 140 is depicted herein as an example. In the embodiment, the insulating layer 140 may comprise one or more openings 180 exposing the respective conducting pads.

In the embodiment, the sensing region or device region 200 of the device substrate 100 comprises a sensing component (not shown) which may be used for sensing biometric features (i.e., the device substrate 100 is a biometric sensing chip, such as a fingerprint-recognition chip). In another embodiment, the device substrate 100 may be used for sensing environmental features. For example, the device substrate 100 may comprise a temperature-sensing component, a humidity-sensing component, a pressure-sensing component, a capacitance-sensing component or another suitable sensing component. In yet another embodiment, the device substrate 100 may comprise an image-sensing component. In one embodiment, the sensing component in the sensing region or device region 200 may be electrically connected to the signal pad region 160 by an interconnection structure (not shown) in the insulating layer 140.

Referring to FIG. 2B, a shallow recess structure may be formed in the device substrate 100 in each chip region 120 by lithography and etching processes (the etching process may comprise a dry etching process, a wet etching process, a plasma etching process, a reactive ion etching process or another suitable process) or a dicing process. In one embodiment, the shallow recess structure comprises a first recess 220, a second recess 230 and a third recess 240 formed by a plurality of lithography and etching processes or dicing processes. The first recess 220 extends from the first upper surface 100a toward the first lower surface 100b along a scribe line (not shown) between the chip regions 120 and then penetrates the insulating layer 140 to expose the underlying substrate 150, and has a first sidewall 220a and a first bottom 220b. In one embodiment, the first sidewall 220a adjoins the insulating layer 140 (i.e., the first sidewall 220a is an edge of the insulating layer 140). In other embodiments, the first recess 220 may further extend into the underlying substrate 150. In the embodiment, the first recess 220 has a depth D1 no greater than 15 μm. In one embodiment, when the first recess 220 is formed by etching the insulating layer 140, the first sidewall 220a may be substantially perpendicular to the first upper surface 100a. For example, the angle between the first sidewall 220a and the first upper surface 100a may be in a range of about 84° to about 90°. In other embodiments, when the first recess 220 is formed by dicing the insulating layer 140, the first sidewall 220a may be inclined to the first upper surface 100a. For example, the angle between the first sidewall 220a and the first upper surface 100a may be in a range of about 55° to about 90°.

The second recess 230 extends from the first bottom 220b toward the first lower surface 100b along the scribe line (not shown) between the chip regions 120, and has a second sidewall 230a and a second bottom 230b. In the embodiment, the second sidewall 230a is substantially perpendicular to the first upper surface 100a. In other embodiments, the second sidewall 230a may be inclined to the first upper surface 100a. In one embodiment, the second sidewall 230a adjoins the substrate 150. In one embodiment, the second recess 230 has a depth D2 smaller than the depth D1. In one embodiment, the second bottom 230b has a width that is smaller than that of the first bottom 220b.

The third recess 240 extends from the second bottom 230b toward the first lower surface 100b along the scribe line (not shown) between the chip regions 120, and has a third sidewall 240a and a third bottom 240b. In the embodiment, the third sidewall 240a is substantially perpendicular to the first upper surface 100a. In other embodiments, the third sidewall 240a may be inclined to the first upper surface 100a. In one embodiment, the third recess 240 has a depth D3 equal to the depth D2. In other embodiments, the depth D3 may smaller or greater than the depth D2. In one embodiment, the third bottom 240b has a width equal to that of the second bottom 230b. In other embodiments, the width of the third bottom 240b may be smaller or greater than that of the second bottom 230b.

Referring to FIG. 2C-1, an insulating layer 260 may be conformally formed on the first upper surface 100a of the device substrate 100 by a deposition process (such as a coating process, a chemical vapor deposition process, a physical vapor deposition process or another suitable process). The insulating layer 260 extends to the opening 180 in the insulating layer 140 and extends to the third sidewall 240a and the third bottom 240b through the first recess 220 and the second recess 230. In the embodiment, the insulating layer 260 may comprise inorganic materials, such as silicon oxide, silicon nitride, silicon oxynitride, metal oxide, a combination thereof, or another suitable insulating material.

Next, the insulating layer 260 in the opening 180 is removed by lithography and etching processes (the etching process may comprise a dry etching process, a wet etching process, a plasma etching process, a reactive ion etching process or another suitable process) to expose a portion of the signal pad region 160. A redistribution layer 280 is then patterned and conformally formed on the insulating layer 260 by a deposition process (such as a coating process, a chemical vapor deposition process, a physical vapor deposition process, an electroplating process, an electroless plating process or another suitable process) and lithography and etching processes.

The redistribution layer 280 extends into the opening 180 and onto the first sidewall 220a and the first bottom 220b, and is electrically connected to the exposed signal pad region 160 through the opening 180. In one embodiment, the redistribution layer 280 does not reach an edge of the first bottom 220b. In other embodiments, the redistribution layer 280 may further extend onto the second bottom 230b or the third bottom 240b. In this case, the depth of the second recess 230 or the third recess 240 may be deeper than that of the first recess 220 and the lateral width of the second bottom 230b or the third bottom 240b may be greater than that of the first bottom 220b. In one embodiment, when the substrate 150 comprises a semiconductor material, the redistribution layer 280 can be electrically insulated from the semiconductor material by the insulating layer 260. In one embodiment, the redistribution layer 280 may comprise copper, aluminum, gold, platinum, nickel, tin, a combination thereof, conductive polymer materials, conductive ceramic materials (such as indium tin oxide or indium zinc oxide), or another suitable conducting material.

In another embodiment, as shown in FIG. 2C-2, when the conducting pad of the signal pad region 160 optionally extends toward the sidewall of the insulating layer 140, which may fully cover the conducting pad of the signal pad region 160 (i.e., the insulating layer 140 does not comprise the opening 180 shown in FIG. 2C-1), a portion of the insulating layer 260 and the insulating layer 140 outside of the signal pad region 160 may be removed by a dicing process so as to expose a sidewall of the conducting pad of the signal pad region 160. Moreover, the sidewall of the conducting pad is coplanar with the edge of the insulating layer 140. Thus, the redistribution layer 280 extending onto the shallow recess structure directly contacts the exposed sidewall of the conducting pad.

In other embodiments, as shown in FIG. 2C-3, the sidewall of the conducting pad of the signal pad region 160 may be exposed by forming the first recess 220, such that the sidewall of the conducting pad is coplanar with the first sidewall 220a of the first recess 220. After the insulating layer 260 is formed in the shallow recess structure, the insulating layer 260 extending onto the first sidewall 220a may be removed by a dicing process so as to expose the sidewall of the conducting pad again. Thus, the redistribution layer 280 directly contacts the exposed sidewall of the conducting pad.

After the redistribution layer 280 is formed as shown in FIGS. 2C-1 to 2C-3, a protection layer 300 may be conformally formed on the redistribution layer 280 and the insulating layer 260 by a deposition process (such as a coating process, a chemical vapor deposition process, a physical vapor deposition process or another suitable process). Using the structure shown in FIG. 2C-1 as an example herein, the protection layer 300 extends into the first recess 220, the second recess 230 and the third recess 240, as shown in FIG. 2D. In the embodiment, the protection layer 300 may comprise inorganic materials, such as silicon oxide, silicon nitride, silicon oxynitride, metal oxide, a combination thereof, or another suitable insulating material.

Next, one or more openings may be formed in the protection layer 300 by lithography and etching processes (the etching process may comprise a dry etching process, a wet etching process, a plasma etching process, a reactive ion etching process or another suitable process) to expose a portion of the redistribution layer 280. In the embodiment, openings 320 and 340 are formed in the protection layer 300 to respectively expose the redistribution layer 280 on the signal pad region 160 and in the first recess 220. In another embodiment, only the opening 340 may be formed in the protection layer 300. In other embodiments, the protection layer 300 may comprise a plurality of openings 340 respectively exposing a portion of the redistribution layer 280 in the first recess 220, the second recess 230 and the third recess 240. It should be realized that the number and position of the opening in the protection layer 300 are determined by design demands and it is not limited thereto.

Next, a dicing process is performed in the device substrate 100 along the scribe lines (not shown) between the chip regions 120 to form a plurality of independent chips. After performing the dicing process, the first recess 220 in the device substrate 100 of each chip extends from the first upper surface 100a toward the first lower surface 100b along a sidewall of the device substrate 100. Moreover, the second recess 230 extends from the first bottom 220b toward the first lower surface 100b along the sidewall of the device substrate 100, and the third recess 240 extends from the second bottom 230b toward the first lower surface 100b along the sidewall of the device substrate 100.

Referring to FIG. 2E, a first substrate/lower substrate 600 and a second substrate 380 are provided. The first substrate 600 is attached onto an upper surface of the second substrate 380 by an adhesive layer (such as a glue) 360. In the embodiment, the first substrate 600 may be a chip, such as a processor, or an interposer. In one embodiment, the first substrate 600 has the same structure as that of the device substrate 100 and the method for forming the first substrate 600 may be the same as or similar to that for forming the device substrate 100 as described above. Elements 140', 150', 160', 180', 220', 220a', 220b', 230', 230a', 230b', 240', 240a', 240b', 260', 280', 300', 320' and 340' in and on the first substrate 600 that are the same as those elements 140, 150, 160, 180, 220, 220a, 220b, 230, 230a, 230b, 240, 240a, 240b, 260, 280, 300, 320 and 340 in and on the device substrate 100, respectively, are not described again for brevity. In other embodiments, the first substrate 600 may have a structure that is different from that of the device substrate 100.

In the embodiment, the second substrate 380 may be a chip, an interposer or a circuit board. Using a circuit board as an example, it may have one or more conducting pads 400 adjacent to the upper surface of the circuit board. Similarly, the conducting pad 400 may be a single conducting layer or comprise multiple conducting layers. To simplify the diagram, only two conducting pads 400 formed of a single conducting layer are depicted herein as an example.

Next, the device substrate 100 of the independent chip is attached onto a second upper surface 600a of the first substrate 600 by an adhesive layer (such as a glue) 580. In the embodiment, the first substrate 600 has a larger size than that of the device substrate 100, such that the device substrate 100 does not cover the shallow recess structure of the underlying first substrate 600.

Referring to FIG. 2F, wires 440 and 450 are formed on the second substrate 380 by a wire bonding process, to electrically connect the device substrate 100 and the first substrate 600, respectively. For example, the second end 440b of the wire 440 is initially formed on the conducting pad 400 of the second substrate 380 and the first end 440a of the wire 440 is subsequently formed on and electrically connected to the redistribution layer 280 extending to the first bottom 220b of the device substrate 100. Similarly, the second end 450b of the wire 450 may be initially formed on the conducting pad 400 of the second substrate 380 and the first end 450a of the wire 450 is subsequently formed on and electrically connected to the redistribution layer 280' extending to the first bottom 220b' of the first substrate 600. In the embodiment, the second end 440b of the wire 440 and/or the second end 450b of the wire 450 is an initial end for wire bonding. Moreover, the wire 440 or 450 may comprise gold or another suitable conducting material.

In one embodiment, the highest portion 440c of the wire 440 protrudes from the first upper surface 100a. In other embodiments, the highest portion 440c of the wire 440 may be lower than the first upper surface 100a. In one embodiment, the highest portion 450c of the wire 450 protrudes from the second upper surface 600a. In other embodiments, the highest portion 450c of the wire 450 may be lower than the second upper surface 600a.

Next, as shown in FIG. 2F, an encapsulant layer 460 may be formed on the first upper surface 100a of the device substrate 100 by a molding process or another suitable process. The encapsulant layer 460 optionally covers the wires 440 and 450 and the first and second substrates 600 and 380 or it may further extend onto the first upper surface 100a to form a flat contacting surface above the sensing region or device region 200. In the embodiment, the encapsulant layer 460 may comprise molding materials or sealing materials.

In one embodiment, when the highest portion 440c of the wire 440 protrudes from the first upper surface 100a, the encapsulant layer 460 on the sensing region or device region 200 has a thickness H1 that is determined by the difference between the distance H2 from the first bottom 220b to the highest portion 440c and the depth D1 of the first recess 220 (i.e., H2-D1). Therefore, the thickness H1 of the encapsulant layer 460 covering the sensing region or device region 200 can be reduced by adjusting the depth D1 of the first recess 220, such that the sensitivity of the sensing region or device region 200 is increased.

Next, a decorative layer (not shown) may additionally be formed on the encapsulant layer 460 by a deposition process (such as a coating process or another suitable process) and may have colors according to design demands to show regions having sensing functions. Moreover, a protection layer (not shown), such as sapphire substrate or hard rubber, may additionally be formed on the decorative layer by a deposition process (such as a coating process, a physical vapor deposition process, a chemical vapor deposition process or another suitable process) to further provide an abrasion-resistant, scrape-proof and high-reliability surface.

According to the aforementioned embodiments, since the first end 440a of the wire 440 is formed in the shallow recess structure of the device substrate 100, the thickness H1 of the encapsulant layer 460 covering the sensing region or device region 200 can be reduced. Accordingly, the sensitivity of the sensing region or device region 200 is increased and the size of the stacked chip package is reduced even further.

Furthermore, since the highest portion 440c can be as low as possible by continuously forming a plurality of recesses in the device substrate 100, rather than forming only one recess and directly extending it downward which removes too much substrate material, the device substrate 100 can have sufficient structural strength. Undercutting at an interface between the insulating layer 140 and the substrate 150 can be prevented as well. Moreover, since a space between the wire 440 and the first bottom 220b is increased by forming the second recess 230 or forming the second and third recesses 230 and 240, a short circuit or a broken circuit due to the wire 440 contacting the edge of the first recess 220 during the wire bonding process can be prevented. As a result, the quality of the stacked chip package is improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A stacked chip package, comprising:
a device substrate having a first upper surface, a first lower surface and a sidewall, wherein the device substrate comprises a sensing region or device region, a signal pad region adjacent to the first upper surface and a shallow recess structure extending from the first upper surface toward the first lower surface along the sidewall of the device substrate;
a redistribution layer electrically connected to the signal pad region and extending into the shallow recess structure;
a first substrate and a second substrate disposed under the first lower surface, wherein the first substrate is between the device substrate and the second substrate; and
a wire having a first end and a second end, wherein the first end is disposed in the shallow recess structure and electrically connected to the redistribution layer, and wherein the second end is electrically connected to the first substrate and/or the second substrate.

2. The stacked chip package as claimed in claim 1, wherein the device substrate is a biometric recognition chip.

3. The stacked chip package as claimed in claim 2, wherein the biometric recognition chip is a fingerprint-recognition chip.

4. The stacked chip package as claimed in claim 1, wherein the first substrate is a chip or an interposer.

5. The stacked chip package as claimed in claim 1, wherein the second substrate is a chip, an interposer or a circuit board.

6. The stacked chip package as claimed in claim 1, wherein the shallow recess structure comprises:
   a first recess having a first sidewall and a first bottom, wherein the redistribution layer extends to the first sidewall and the first bottom; and
   a second recess under the first recess, having a second sidewall and a second bottom and extending from the first bottom toward the first lower surface.

7. The stacked chip package as claimed in claim 6, wherein the first bottom has a width that is greater than that of the second bottom, and the first end of the wire is disposed on the redistribution layer extending to the first bottom.

8. The stacked chip package as claimed in claim 6, wherein the redistribution layer further extends to the second sidewall and the second bottom, and the first end of the wire is disposed on the redistribution layer extending to the second bottom, and wherein the second bottom has a width that is greater than that of the first bottom.

9. The stacked chip package as claimed in claim 6, wherein the device substrate comprises an insulating layer and an underlying substrate, and wherein the first sidewall of the first recess adjoins the insulating layer and a portion of the underlying substrate and the second sidewall of the second recess adjoins the underlying substrate in the device substrate.

10. The stacked chip package as claimed in claim 1, wherein the second end of the wire is an initial end for wire bonding.

11. The stacked chip package as claimed in claim 1, wherein the first substrate has a second upper surface, a second lower surface and a sidewall, and wherein the first substrate comprises an another shallow recess structure extending from the second upper surface toward the second lower surface along the sidewall of the first substrate.

12. The stacked chip package as claimed in claim 11, wherein the second end of the wire is disposed in the another shallow recess structure.

13. The stacked chip package as claimed in claim 11, further comprising an another wire having a first end and a second end, wherein the first end of the another wire is disposed in the another shallow recess structure, and the second end of the another wire is disposed on the second substrate.

14. The stacked chip package as claimed in claim 1, wherein the wire has a highest portion under the first upper surface.

15. The stacked chip package as claimed in claim 1, further comprising an encapsulant layer covering the wire and the first upper surface to form a flat contacting region above the sensing region or device region, wherein the wire has a highest portion protruding from the first upper surface, and the encapsulant layer on the sensing region or device region has a thickness determined by a difference between a distance between the highest portion of the wire and a bottom of the shallow recess structure and a depth of the shallow recess structure.

16. The stacked chip package as claimed in claim 1, wherein the redistribution layer extending into the shallow recess structure contacts a sidewall of a conducting pad of the signal pad region.

17. A stacked chip package, comprising:
   an upper substrate having a first upper surface, a first lower surface and a first sidewall, wherein the upper substrate comprises a first signal pad region adjacent to the first upper surface and a first shallow recess structure extending from the first upper surface toward the first lower surface along the first sidewall;
   a lower substrate having a second upper surface, a second lower surface and a second sidewall, wherein the lower substrate comprises a second signal pad region adjacent to the second upper surface and a second shallow recess structure extending from the second upper surface toward the second lower surface along the second sidewall;
   a first redistribution layer electrically connected to the first signal pad region and extending into the first shallow recess structure;
   a second redistribution layer electrically connected to the second signal pad region and extending into the second shallow recess structure;
   a circuit board;
   a first wire disposed in the first shallow recess structure, wherein the first wire is electrically connected to the first redistribution layer and the lower substrate or the circuit board; and
   a second wire disposed in the second shallow recess structure, wherein the second wire is electrically connected to the second redistribution layer and the upper substrate or the circuit board.

18. The stacked chip package as claimed in claim 17, wherein the upper substrate is a biometric recognition chip.

19. The stacked chip package as claimed in claim 18, wherein the biometric recognition chip is a fingerprint-recognition chip.

20. The stacked chip package as claimed in claim 18, wherein the lower substrate is a chip or an interposer.

21. The stacked chip package as claimed in claim 17, wherein the upper substrate and the lower substrate are the same with respect to the respective redistribution layer extending into the shallow recess structure.

22. The stacked chip package as claimed in claim 17, wherein the first redistribution layer extending into the first shallow recess structure contacts a sidewall of a conducting pad of the first signal pad region.

23. A method for forming a stacked chip package, comprising:
   providing a device substrate having a first upper surface, a first lower surface and a sidewall, wherein the device substrate comprises:
     a sensing region or device region and a signal pad region adjacent to the first upper surface; and
     a shallow recess structure extending from the first upper surface toward the first lower surface along the sidewall, wherein the shallow recess structure has at least a first recess and a second recess under the first recess;
   forming a redistribution layer on the first upper surface and extending into the shallow recess structure to electrically connect the signal pad region;
   providing a first substrate and a second substrate under the first lower surface, wherein the first substrate is between the device substrate and the second substrate;
   forming a wire having a first end and a second end, wherein the first end is disposed in the shallow recess structure and electrically connected to the redistribution layer, and the second end is disposed on and electrically connected to the first substrate and/or the second substrate; and
   covering the wire, the first upper surface, the first substrate and the second substrate by an encapsulant layer to form a flat contacting region.

* * * * *